United States Patent [19]

Takeshita

[11] Patent Number: 5,521,586
[45] Date of Patent: May 28, 1996

[54] ELECTRONIC APPARATUS

[75] Inventor: Hideki Takeshita, Hadano, Japan

[73] Assignee: Ricoh Company, Ltd., Tokyo, Japan

[21] Appl. No.: 262,259

[22] Filed: Jun. 20, 1994

[30] Foreign Application Priority Data

Jun. 30, 1993 [JP] Japan .................. 5-162191

[51] Int. Cl.⁶ .................................. G08B 21/00
[52] U.S. Cl. .................. 340/635; 340/654; 340/687; 324/133; 324/158.1
[58] Field of Search ................... 340/635, 654, 340/687; 324/158.1, 133

[56] References Cited

U.S. PATENT DOCUMENTS

| | | | |
|---|---|---|---|
| 4,507,697 | 3/1985 | Ozil et al. | 340/687 |
| 4,949,035 | 8/1990 | Palmer, II | 340/687 |
| 5,304,987 | 4/1994 | Brunson et al. | 340/654 |
| 5,347,265 | 9/1994 | Shimura | 340/635 |

FOREIGN PATENT DOCUMENTS

| | | |
|---|---|---|
| 2-105984 | 4/1990 | Japan . |
| 4-33162 | 3/1992 | Japan . |
| 4-36626 | 3/1992 | Japan . |
| 4-191993 | 7/1992 | Japan . |
| 4-136863 | 12/1992 | Japan . |
| 5-73886 | 10/1993 | Japan . |

*Primary Examiner*—John K. Peng
*Assistant Examiner*—Daniel J. Wu
*Attorney, Agent, or Firm*—Oblon, Spivak, McClelland, Maier & Neustadt

[57] ABSTRACT

The present invention provides an electronic apparatus to be detachably loaded with an IC card. The apparatus comprises a loading operation detecting unit for detecting a loading operation of the IC card; an unloading operation detecting unit for detecting a unloading operation of the IC card; and an IC card controlling portion for controlling an input/output of the IC card based on a result detected by one of the loading operation detecting unit and the unloading operation detecting unit. The loading operation detecting unit and the unloading operation detecting unit each includes an elastic conductor member for detecting a contacting thereof with a frame ground terminal plate disposed on an outer portion of the IC card. The elastic conductor member of the loading operation detecting unit is positioned so as to be in contact with the terminal plate before a lead of the IC card is in contact with a connecter of the electronic apparatus on loading operation of the IC card, and to keep a contacted state while being in loading state of the IC card. And the elastic conductor member of the unloading operation detecting unit is positioned so as to keep the contacted state thereof with the terminal plate while being in the loading state of the IC card, and to shut off the contacted state with the terminal plate while the lead of the IC card is in contact with the connecter of the electronic apparatus, when the IC card is unloaded.

3 Claims, 5 Drawing Sheets

ELECTRONIC APPARATUS

BACKGROUND OF THE INVENTION

1. Field of the invention

The present invention relates to an electronic apparatus, particularly to an electronic apparatus which can be equipped with an IC card.

2. Description of the Related Art

In a case where an IC card is loaded to or unloaded from an electronic apparatus, a user normally loads or unloads the IC card after a power supply to the electronic apparatus is turned off. Or, a detecting means such as a micro switch and the like is disposed in an IC card inserting portion on the electronic apparatus, then, a runaway of a CPU (usually, a micro processor) used in the electronic apparatus or a data destruction on the IC card is prevented from stopping of supplying the power supply to a connecter on loading or unloading of the IC card.

However, an error operation can not be perfectly avoided under a situation that a turn-on/turn-off operation of the power supply is left to only the user. Also, if the detecting means such as the micro switch and the like is disposed, not only a cost is increased because of increases of the number of parts and the number of processings, but also a miniaturization of an apparatus is prevented because of a space for a switch.

Further, although the loading/unloading of the IC card can be detected by using the micro switch and the like, however, it can not be detected in case of an unstable operation on loading/unloading operation of the IC card, or an interruption of the loaded operation, etc. For example, in a case where an inserted state of the IC card is unstable, so that the IC card is once in contact with the connecter and then a contacted state thereof is disconnected, although the inserted state of the IC card is detected and supplying the power supply to the connecter is stopped, then an electrical contact is detected and then supplying the power supply to the connecter is started, the IC card may not be actually loaded to the connecter. Or, in a case where after an unloading operation is once tried, the IC card is again inserted, even if the unloading operation is detected and the supplying the power supply to the connecter is stopped, the error operation by the user results in the data destruction.

SUMMARY OF THE INVENTION

It is therefore an object of the present invention to solve the problems mentioned above, and to provide an electronic apparatus which is compact and is capable of detecting an loading/unloading operation of an IC card at a stable state and of performing the loading/unloading operation to and from the electronic apparatus under a condition that a signal line is cut off on turning off the power supply.

According to the present invention, the object mentioned above is attained by an electronic apparatus to be detachably loaded with an IC card, of Claim 1, comprising:

a loading operation detecting means for detecting a loading operation of the IC card;

an unloading operation detecting means for detecting a unloading operation of the IC card; and an IC card controlling portion for controlling an input/output of the IC card based on a result detected by one of the loading operation detecting means and the unloading operation detecting means, wherein the loading operation detecting means and the unloading operation detecting means each includes an elastic conductor member for detecting a contacting thereof with a frame ground terminal plate disposed on an outer portion of the IC card, the elastic conductor member of the loading operation detecting means is positioned so as to be in contact with the terminal plate before a lead of the IC card is in contact with a connecter of the electronic apparatus on loading operation of the IC card, and to keep a contacted state while being in loading state of the IC card, and the elastic conductor member of the unloading operation detecting means is positioned so as to keep the contacted state thereof with the terminal plate while being in the loading state of the IC card, and to shut off the contacted state with the terminal plate while the lead of the IC card is in contact with the connecter of the electronic apparatus, when the IC card is unloaded Further, according to the present invention, the object mentioned above is attained by an electrical apparatus of Claim 2, wherein the IC card controlling portion checks an electrical connection between the lead of the IC card and the connecter of the electronic apparatus after an elapse of a predetermined time since receiving a detection of the loading operation of the IC card by the loading operation detecting means on loading the IC card, alternately checks a result detected by the loading operation detecting means and the checked electrical connection in a case where the checked electrical connection is not detected, and stops supplying a power supply to the connecter and a connection to a signal line until the checked electrical connection is detected.

In addition, according to the present invention, the object mentioned above is attained by an electrical apparatus of Claim 3, wherein the IC card controlling portion prohibits an access to the IC card, reads out a result detected by the loading operation detecting means after an elapse of a predetermined time, when the unloading operation of the IC card is detected by the unloading operation detecting means, and allows the access to the IC card in a case where the unloading operation of the IC card is not detected by the unloading operation detecting means.

The electronic apparatus with a construction as mentioned above comprises a switch by using the FG terminal plates and the elastic conductors. Thereby, a cost thereof is cheap. Further, the electronic apparatus mentioned above can be made smaller than that having a mechanism consisting of a part such as a micro switch and the like.

Furthermore, the electronic apparatus according to the present invention checks the electrical connection after an elapse of a predetermined time, after the loading operation is detected by the loading operation detecting means. In a case where the electrical connection can not be confirmed, the apparatus again checks the electrical connection, and a signal detected by the loading operation detecting means. Then, the apparatus connects the power supply and the signal line after both conditions are confirmed. Therefore, the apparatus can correspond to the unstable operation.

In addition, at a time of the unloading operation, the apparatus prohibits the access to the IC card, until the IC card is removed from the connecter. Then, the apparatus allows the access to the IC card, in a case where the inserted state of the IC card is kept after an elapse of a predetermined time. Thereby, the data destruction can not occur, even if the user makes an error operation.

Further object and advantages of the present invention will be apparent from the following description of the

DESCRIPTION OF THE PREFERRED EMBODIMENTS

Embodiments of the present invention will be described in detail hereinafter with reference to the accompanied drawings.

Figure 1:
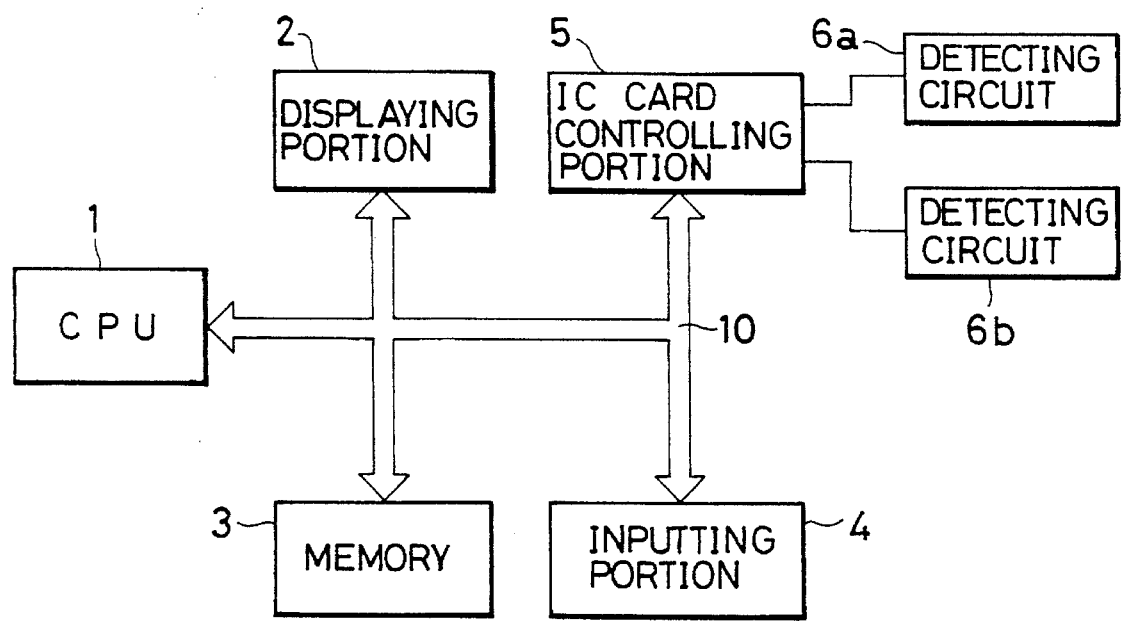
FIG. 1 is a block diagram of an electronic apparatus in one embodiment according to the present invention.

FIG. 1 is a block diagram showing a whole construction of one embodiment of the present invention. A CPU 1 comprises micro processors, and controls an execution of a program stored in a memory 3 and an input/output of data. A displaying portion 2 displays a character, a figure and the like, which comprises a liquid crystal display and the like. The memory 3 comprises a RAM and a ROM. The ROM stores the program carrying out a predetermined processing, such as a processing on turning on a power supply, etc, and stores a data necessary to execute the program. The program and the data read from an outer device such as an IC card and the like are used, after they are inputted into the RAM.

An inputting portion 4 comprises a key switch and the like. The data and a command are inputted to the inputting portion 4 by a user. The data and the command inputted to the inputting portion 4 are displayed on the displaying portion 2, if necessary. An IC card controlling portion 5 controls the input/output of the data from and to an IC card 7, and an operation of a power supply device (not shown). The IC card controlling portion 5 is connected to a lead 9 (a pin) of the IC card 7 through an IC card connecter 24. The IC card connecter 24 includes signal lines of the data and addresses, a card detecting signal line for detecting that the IC card 7 is connected thereto, and a terminal for supplying the power supply to the IC card.

Detecting circuits 6a, 6a detect an loading/unloading of the IC card 7 to the electronic apparatus. Output signals from the circuits 6a, 6a are transmitted to the IC card controlling portion 5. Due to the output signals, the IC card controlling portion 5 controls to supply the power supply to the IC card connecter 24, a cut off of the signal line, a recovery thereof and the like.

A bus 10 is signal lines for transmitting signals which indicate the data and the addresses among the CPU 1, the memory 3 and an input/output apparatus.

Figure 2:
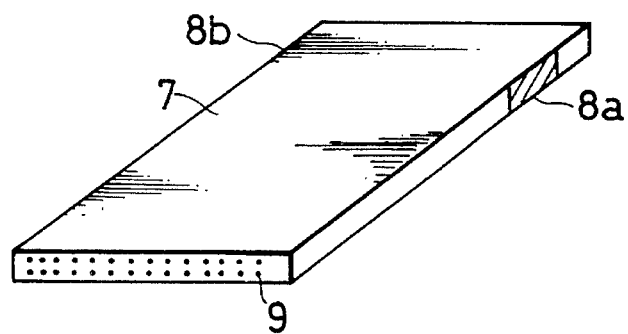
FIG. 2 is a perspective view of an IC card.

FIG. 2 shows a perspective view of the IC card used in the embodiment of the present invention. The IC card 7 has at one end thereof a lead 9 to be engaged with the IC card connecter 24, and has FG (frame ground) terminal plates 8a, 8b at parts on both sides thereof. The FG terminal plates 8a and 8b are adapted to connect the IC card 7 to a GND (a ground) in a case where the IC card 7 is connected to an apparatus, thereby a potential of the IC card 7 is stabilized for the sake of a noise reduction, etc.

Figure 3:
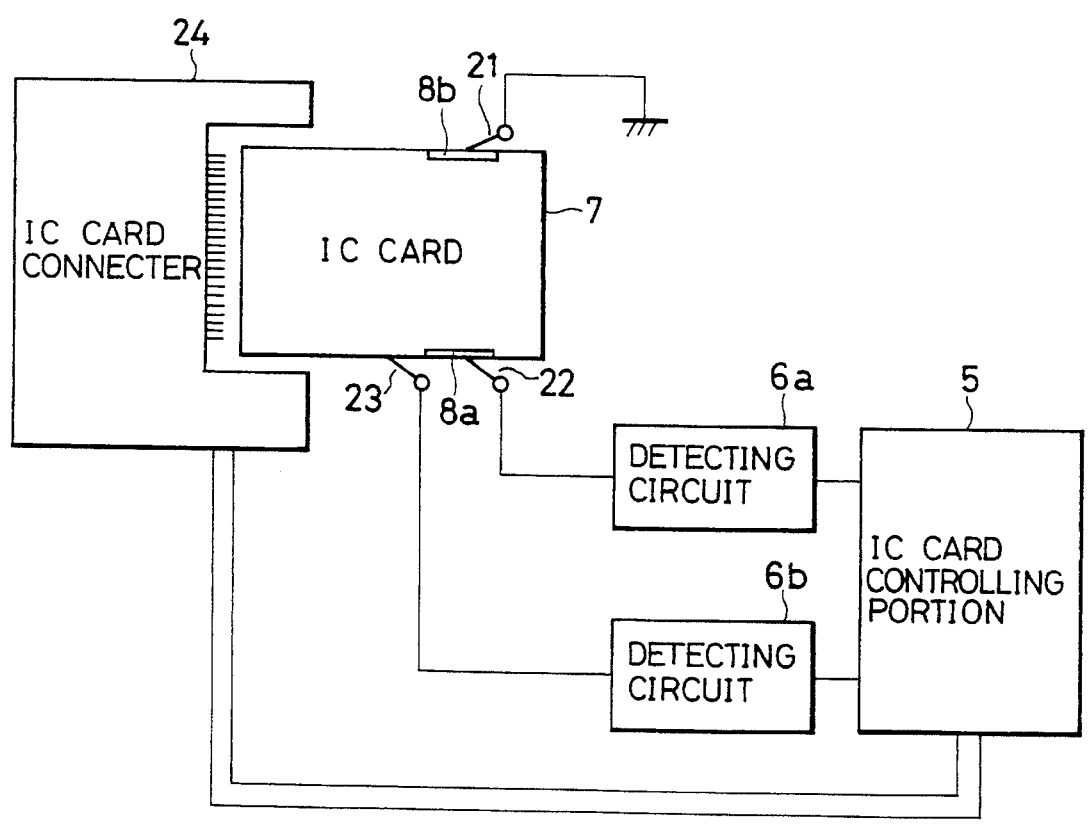
FIG. 3 is an explanation view showing an loading/unloading detecting of the IC card in one embodiment of the present invention.

FIG. 3 shows one embodiment of the detecting circuit for detecting the loading/unloading of the IC card 7 to the electronic apparatus. At first, an IC card loading operation detecting means is explained hereinafter. When the IC card 7 is inserted into the electrical apparatus, the FG terminal plates 8a, 8b disposed on the both sides of the IC card 7 are in contact with blade springs 21, 22 made of elastic conductors, before the lead 9 of the IC card 7 is in contact with the IC card connecter 24.

Figure 4:
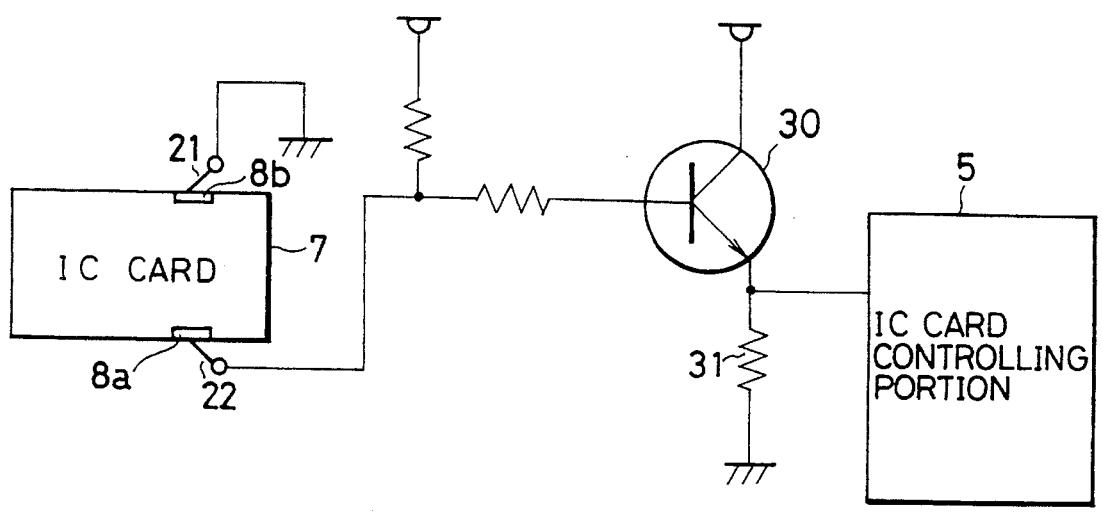
FIG. 4 is an explanation view of a detecting circuit in one embodiment of the present invention.

The blade spring 21 is connected to the GND in order to realize an essential purpose. The blade spring 22 is connected to the detecting circuit 6a, one example of which is shown in FIG. 4. The FG terminal plates 8a, 8b are electrically connected to each other inside of the IC card. The blade springs 21, 22 are in contact with the FG terminal plates 8b, 8a, respectively. So, electrical potentials of the blade springs 21, 22 are dropped to the GND.

FIG. 4 shows one embodiment of the detecting circuit 6a which detects the loading operation of the IC card 7 by detecting a change of the electrical potential of the blade spring 22.

The blade spring 22 is connected to a base of a transistor 30 which is pulled up. An emitter of the transisiter 30 is connected to an emitter resistance 31 and the IC card controlling portion 5.

The blade springs 21, 22 each constitute a switch in association with the FG terminal plates 8a, 8b. When the blade springs 21, 22 each is respectively in contact with the FG terminal plates 8b, 8a, the switch is turned on. Thereby, the potential of the blade spring 22 which is pulled up is dropped to a GND level, and a bias voltage applied on a base terminal of a transistor 30 becomes zero. Therefore, a collector current of the transistor 30 does not flow. Accordingly, a voltage applied between both ends of an emitter resistance 31 becomes zero. In other words, the voltage inputted to the IC card controlling portion 5 is of a positive potential under a condition that the IC card 7 is not inserted into the electronic apparatus. The voltage becomes zero just before the IC card 7 is in contact with the IC card connecter 24. Then, the loading operation of the IC card can be detected.

Returning to FIG. 3, an embodiment of the unloading operation detecting means which detects the unloading of the IC card 7 is explained hereinafter. A blade spring 23 is also connected to a detecting circuit 6b which is the same as shown in FIG. 4 for the blade spring 22. The blade spring 23 is adapted to detect the unloading of the IC card 7, and is adapted to be spaced from the FG terminal plate 8a, when the IC card 7 moves to an unloaded direction by a little shorter distance than an effective engagement length between the lead 9 of the IC card 7 and the IC card connecter 24. Therefore, the output voltage from the detecting circuit 6b is zero, while the IC card 7 is loaded into the electronic apparatus, inversely in case of the loading of the IC card. A predetermined output voltage is adapted to be generated in the detecting circuit 6b, when the IC card 7 moves to the unloaded direction by a little shorter distance than an effective engagement length of the IC card connecter 24, while the lead 9 of the IC card 7 is in contact with the IC connecter 24.

Figure 5:
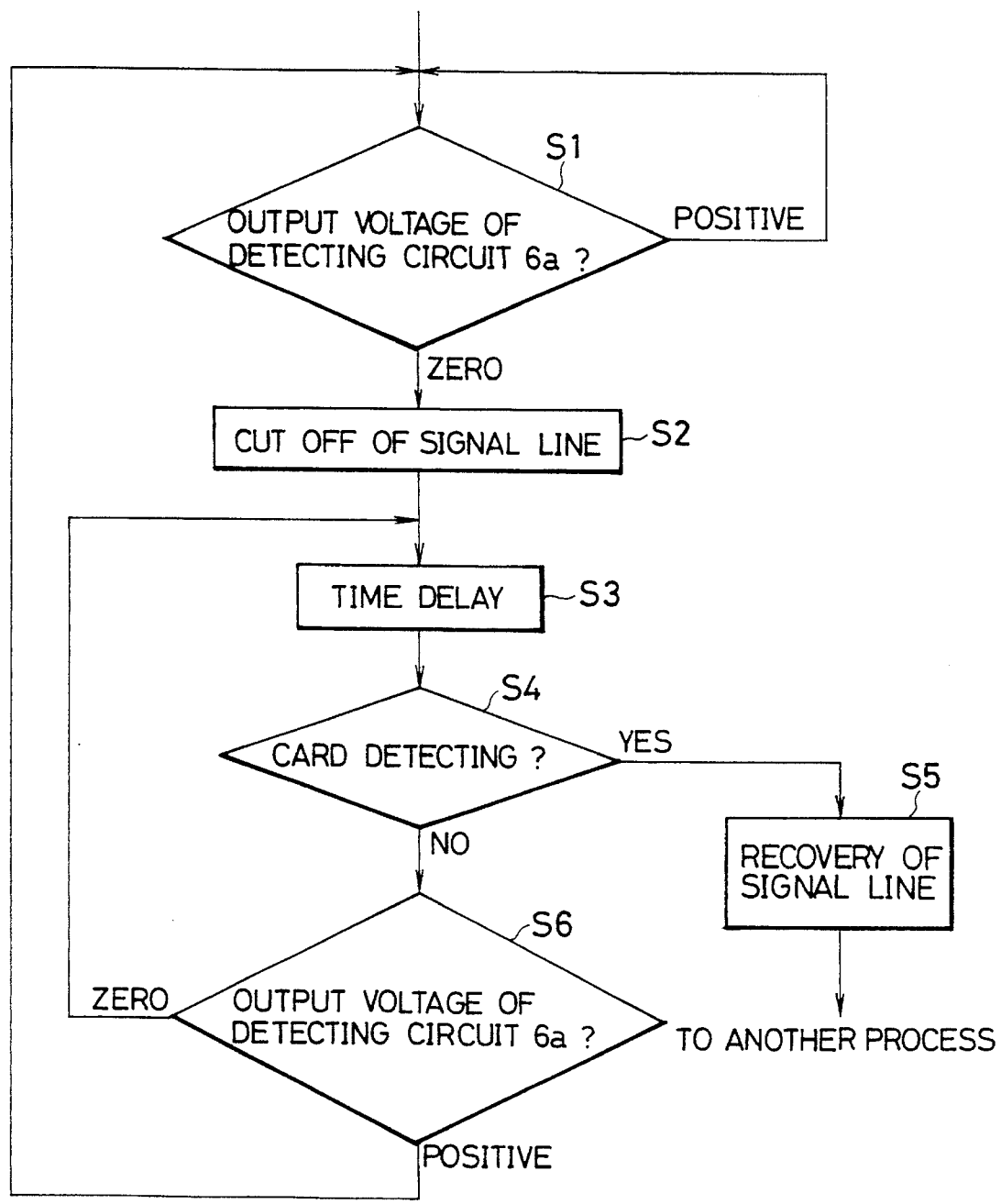
FIG. 5 is a flow chart illustrating an operation on loading the IC card.

A processing on loading the IC card 7 will be described in detail hereinafter with reference to FIG. 5.

This processing is performed by the IC card controlling portion 5, based on the output voltage of the detecting circuit 6a. At first, the IC card controlling portion 5 monitors whether the output voltage of the detecting circuit 6a is zero or not (a step S1), and cuts off the signal lines to other IC card 7 except the card detecting signal line, when it is detected that the output voltage of the detecting circuit 6a is zero (a step S2). Next, the IC card controlling portion 5 checks the card detecting signal line after an elapse of a predetermined time, for example, 1 second (a step S3), and judges whether the lead 9 of the IC card 7 is in contact with the IC card connecter 24 electrically (a step S4). In a case where an electrical contact between the lead 9 and the connecter 24 is confirmed, the IC card controlling portion 5 assumes that the IC card 7 is correctly loaded, and recovers the signal lines which were cut off (a step S5). In a case where an electrical contact between the lead 9 and connecter 24) is not confirmed, the IC card controlling portion 5 checks the output voltage from the detecting circuit 6a, and the card detecting signal line, alternately in a predetermined time interval. Then, in a case where a card detecting signal is detected and the output voltage from the detecting circuit 6a is zero, the IC card controlling portion 5 recovers the signal lines which were cut off. However, even if either contacted state is confirmed, unless the other contacted state is confirmed by a second check, the IC card controlling portion 5 regards it as an unstably contacted state, and again performs the processing which has been done from the beginning.

Figure 6:
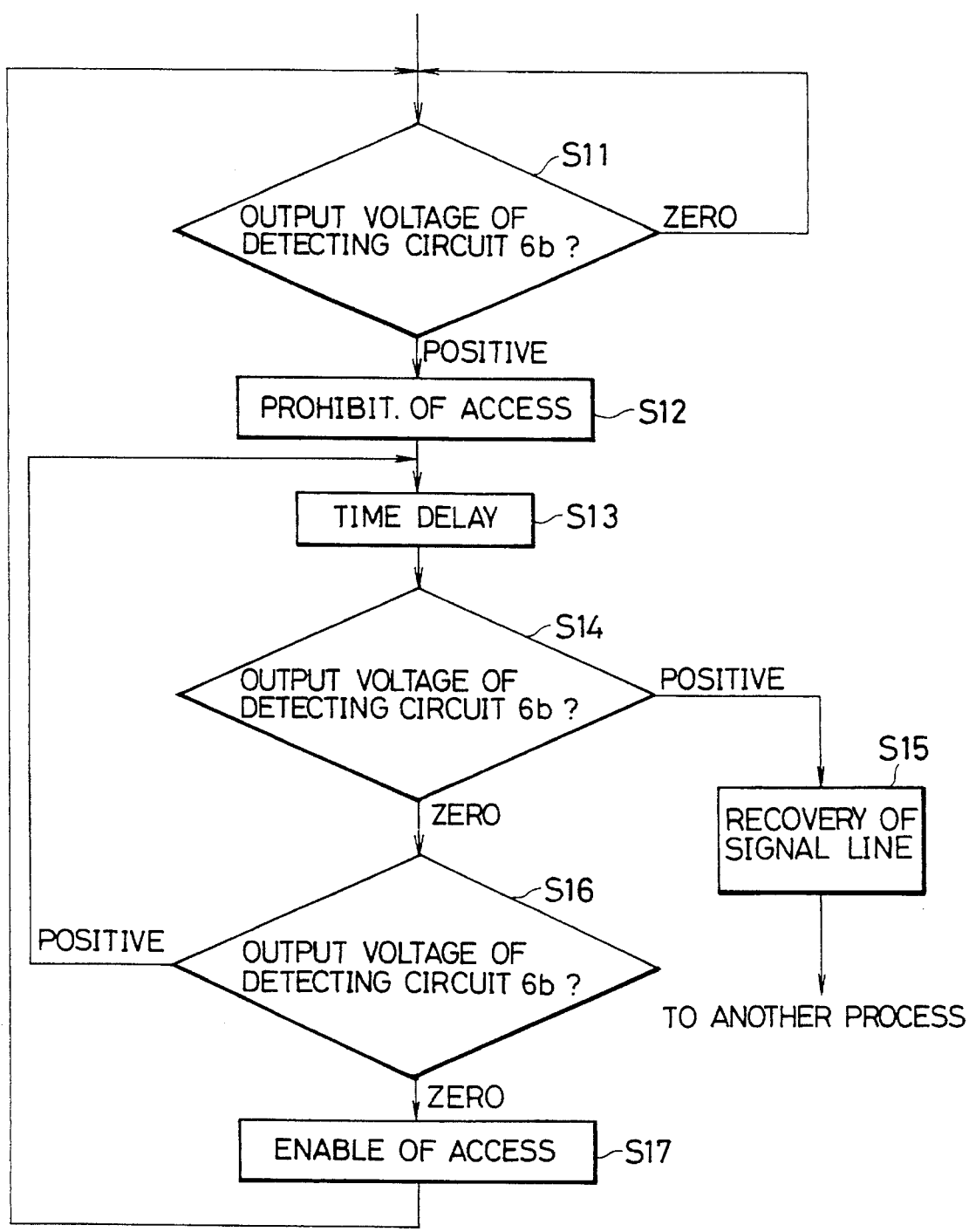
FIG. 6 is a flow chart illustrating an operation on unloading the IC card.

FIG. 6 shows the processing based on the unloading detection of the IC card 7. This processing is also performed by the IC card controlling portion 5, based on the output voltages from the detecting circuits 6a, 6b.

In FIG. 6, the IC card controlling portion 5 monitors the voltage of the detecting circuit 8b (a step S11). When a positive voltage is detected, the IC card controlling portion 5 prohibits an access to the IC card 7 (a step S12). The lead 9 of the IC card 7 is kept in contact with the connecter 24, in this state. Next, the IC card controlling portion 5 checks the voltage of the detecting circuit 6a (a step S14) after an elapse of a predetermined time (a step S13). The detecting circuit 6a is connected to an elestic conductor member which detects the loading operation. In a case where the positive voltage is confirmed, it indicates that the unloading operation has been finished. Thereby, the IC card controlling portion 5 stops supplying the power supply to the IC card connecter 24 (a step S15). However, in a case where the voltage of the detecting circuit 6a is zero, it indicates that the unloading operation of the IC card 7 has not been finished. Thereby, the IC card controlling portion 5 again checks the voltage of the detecting circuit 6b (a step S16). In a case where the output voltage is zero (in other words, the state that the lead 9 of the IC card 7 is in contact with the connecter 24), the IC card controlling portion 5 judges that the unloading operation is interrupted, and releases a prohibition of the access. Then, the processing is returned to the beginning. In a case where the output voltage from the detecting circuit 6b is positive, the IC card controlling portion 5 judges that the unloading operation is on a middle state thereof, and checks the output voltage from the detecting circuits 6a, 6b, alternately in a predetermined time interval. When a finish of the unloading operation is detected, the IC card controlling portion 5 stops supplying the power supply to the IC card connecter 24. The IC card controlling portion 5 releases the prohibition of the access, when judging that the unloading operation is interrupted. Then, the processing is returned to the beginning (a step S17).

As mentioned above, an electronic apparatus to be detachably loaded with an IC card according to the present invention is adapted to detect a loading/unloading operation by means of a contact between a frame ground terminal plate which is disposed on the IC card and an elastic conductor member. Thereby, the electronic apparatus having the construction mentioned above can be made smaller than that having a mechanism detected by a micro switch. Further, an electrical contact is detected after an elapse of a predetermined time from a detection of the operation. In a case where two detectings mentioned above are not in a predetermined combination state, the detecting is repeated, until a potential state is stabilized. Thereby, the apparatus having the construction according to the present invention can correspond to an unstable operation or an interruption at a time of the loading/unloading operation of the IC card, accordingly a runaway of a CPU and a data destruction on the IC card can be prevented.

Many widely different embodiments of the present invention may be constructed without departing from the spirit and scope of the present invention. It should be understood that the present invention is not limited to the specific embodiments described in the specification, except as defined in the appended claims.

What is claimed is:

1. An electronic apparatus to which an IC card is detachably loaded, said IC card including an integrated circuit therein and having an electrode on one end for accepting an IC card connector of said apparatus and a frame ground terminal plate on an outer portion thereof, the apparatus comprising:

a loading operation detecting means for detecting a loading operation of said IC card;

an unloading operation detecting means for detecting an unloading operation of said IC card; and an IC card controlling portion for controlling an input/output of power supply and data to/from said IC card based on a result detected by one of said loading operation detecting means and said unloading operation detecting means, wherein said loading operation detecting means and said unloading operation detecting means each includes an elastic conductor member for detecting a contacting thereof with said frame ground terminal plate, said elastic conductor member of said loading operation detecting means is positioned so as to be in contact with said terminal plate before said electrode of said IC card is in contact with a connector of said electronic apparatus on loading operation of said IC card, and to keep a contacted state while said IC card is in loading state, and said elastic conductor member of said unloading operation detecting means positioned so as to keep a contacted state thereof with said terminal plate while said IC card is in the loading state, and to shut off the contact state with said terminal plate just after said electrode of said IC card is discontacted with said connector of said electronic apparatus, when said IC card is unloaded.

2. An electronic apparatus according to claim 1, wherein said IC card controlling portion checks an electrical connection between said electrode of said IC card and said connector of said electronic apparatus after an elapse of a predetermined time since receiving a detection of said loading operation of said IC card by said loading operation detecting means on loading said IC card, alternately checks a result detected by said loading operation detecting means and said chocked electrical connection in case where said checked electrical connection is not detected, and stops supplying a power supply to said connector and a connection to a signal line until said checked electrical connection is detected.

3. An electronic apparatus according to any of claims 1 or 2, wherein said IC card controlling portion prohibits an access to said IC card when said unloading operation of said IC card is detected by said unloading operation detecting means, and read out a result detected by said loading operation detecting means after an elapse of a predetermined time, and allows the access to said IC card in a case where said loading operation of said IC card is detected by said loading operation detecting means.

* * * * *